United States Patent
Rose et al.

(10) Patent No.: US 9,472,549 B2
(45) Date of Patent: Oct. 18, 2016

(54) CASCODED SEMICONDUCTOR DEVICES

(71) Applicant: NXP B.V., Eindhoven (NL)

(72) Inventors: Matthias Rose, Helmond (NL); Jan Sonsky, Leuven (BE); Philip Rutter, Stockport (GB)

(73) Assignee: NXP B.V., Eindhoven (NL)

( * ) Notice: Subject to any disclaimer, the term of this patent is extended or adjusted under 35 U.S.C. 154(b) by 415 days.

(21) Appl. No.: 14/056,648

(22) Filed: Oct. 17, 2013

(65) Prior Publication Data

US 2014/0145208 A1 May 29, 2014

(30) Foreign Application Priority Data

Nov. 23, 2012 (EP) ..................... 12194083

(51) Int. Cl.
*H01H 47/00* (2006.01)
*H01L 27/088* (2006.01)
*H01L 27/08* (2006.01)
*H03K 17/567* (2006.01)
*H03K 17/687* (2006.01)
*H03K 17/74* (2006.01)

(52) U.S. Cl.
CPC ......... *H01L 27/088* (2013.01); *H01L 27/0814* (2013.01); *H03K 17/567* (2013.01); *H03K 17/6871* (2013.01); *H03K 17/6874* (2013.01); *H03K 17/74* (2013.01); *H03K 2017/6875* (2013.01)

(58) Field of Classification Search
USPC .................................................. 307/113, 115
See application file for complete search history.

(56) References Cited

U.S. PATENT DOCUMENTS

| 6,535,050 | B2 | 3/2003 | Baudelot et al. |
| 6,633,195 | B2 | 10/2003 | Baudelot et al. |
| 8,264,277 | B2 | 9/2012 | Igarashi et al. |
| 8,710,543 | B2 | 4/2014 | Ichikawa |

FOREIGN PATENT DOCUMENTS

| CN | 102237854 A | 11/2011 | |
| CN | 102769451 A | 11/2012 | |
| DE | 199 02 520 A1 | 8/2000 | |
| EP | 1063757 | * 12/2000 | ............. H02M 1/32 |
| EP | 2736073 A1 | 5/2014 | |
| WO | 00/44088 A1 | 7/2000 | |

OTHER PUBLICATIONS

Haehre, K. et al. "Switching Speed-Control of an Optimized Capacitor-Clamped Normally-on Silicon Carbide JFET Cascade", 15th Intl. Power Electronics and Motion Control Conf., pp. DS1a.11-1-DS1a.11-5 (Sep. 2012).

(Continued)

*Primary Examiner* — Rexford Barnie
*Assistant Examiner* — Dru Parries

(57) ABSTRACT

A cascoded power semiconductor circuit has a clamp circuit between the source and gate of a gallium nitride or silicon carbide FET to provide avalanche protection for the cascode MOSFET transistor.

13 Claims, 3 Drawing Sheets

(56) References Cited

OTHER PUBLICATIONS

Kelley, R.L. et al. "Power Factor Correction Using an Enhancement-Mode SiC JFET", IEEE Power Electronics Spec. Conf., pp. 4766-4769 (Jun. 2008).
Mazzola, Michael S. et al. "Application of a Normally OFF Silicon Carbide Power JFET in a Photovoltaic Inverter" 24$^{th}$ Annual IEEE Applied Power Electronics Conf. and Exposition, pp. 649-652 (Feb. 2009).

Kelley, R. et al. "SiC JFET Gate Driver Design for use in DC/DC Converters", 21$^{st}$ Annual IEEE Applied Power Electronics Conf. and Exposition, pp. 179-482 (Mar. 2006).
Saito, W. et al. "High Voltage and High Switching Frequency Power-Supplies using a GaN-HEMT", IEEE Proc. CS-IC Symp., pp. 253-256 (Nov. 2006).
Extended European Search Report for EP Patent Appln. No. 12194083.7 (Apr. 23, 2013).

* cited by examiner

CASCODED SEMICONDUCTOR DEVICES

CROSS-REFERENCE TO RELATED APPLICATIONS

This application claims the priority under 35 U.S.C. §119 of European patent application no. 12194083.7, filed on Nov. 23, 2012, the contents of which are incorporated by reference herein.

This invention relates to cascoded semiconductor devices. It relates in particular to depletion mode transistors, such as gallium nitride (GaN) (e.g. GaN high electron mobility transistors (HEMTs)), or silicon carbide (SiC) field effect transistors.

The invention is of particular interest for GaN power transistors. Basic GaN power semiconductors are depletion mode (normally-on) devices. This presents a problem that a GaN power transistor cannot be used in a circuit designed for a MOSFET transistor without significant circuit modification.

Attempts to introduce additional layers in the layer stack of the power semiconductor to make the device normally-off (and thereby interchangeable with MOSFETs) come together with device performance penalties.

It is known to provide a GaN power transistor in a cascode circuit with a silicon MOSFET switch. Cascoding high-voltage GaN switches with conventional low-voltage silicon MOSFETs is a viable option to combine the advantages of Silicon and GaN power devices.

An advantage of a cascoded switch is that existing standard gate drivers can then be used, as the device drive characteristics are mainly defined by the silicon MOSFET. Therefore the device can be used as a direct replacement for silicon MOSFETs or IGBTs.

FIG. 1 shows a well-known approach of a series connection of a normally-on gallium nitride transistor ($M_{GaN}$) and a normally-off silicon MOSFET transistor ($M_{Si}$) power switch in a cascode configuration. This approach is becoming more and more popular for power electronic applications as new GaN and SiC power semiconductors with superior device characteristics compared to Silicon based switches are emerging.

In the standard cascode configuration of FIG. 1, only the power MOSFET $M_{Si}$ is controlled actively by a gate driver, which generates the gate signal $V_{GM}$. The GaN switch $M_{GaN}$ is controlled indirectly via the silicon MOSFET $M_{Si}$ as the MOSFET drain-to-source voltage is connected to equal the GaN source-to-gate voltage.

A problem of the circuit of FIG. 1 is that the low voltage rated power MOSFET device is not protected from avalanche. Avalanche problems result in reliability issues of the silicon MOSFET due to a high drain-source voltage. Avalanche or gate isolation breakdown can also occur in the GaN/SiC field effect transistor due to high source-gate voltages.

According to the invention, there is provided a transistor circuit as defined in the claims.

According to one aspect, there is provided a cascode transistor circuit comprising:

a gallium nitride or silicon carbide field effect transistor having its drain connected to a high power rail and its gate connected to a low power rail;

a silicon MOSFET with its drain connected to the source of the gallium nitride or silicon carbide FET and its source connected to the low power rail; and a clamp circuit between the source and gate of the gallium nitride or silicon carbide FET.

The term "cascode" is used to denote the series connection of the channels of the two transistors.

The clamp circuit of the invention enables the circuit to be used more widely in power conversion applications, by preventing avalanche through the low voltage silicon MOSFET due to high drain-source voltages, and preventing avalanche or gate isolation breakdown of the GaN/SiC field effect transistor due to high source-gate voltages. The clamp circuit preferably limits the voltage of the gallium nitride or silicon carbide FET source with respect to the gate, and equivalently (because of the circuit connections) the MOSFET drain with respect to its source.

The gallium nitride or silicon carbide FET is preferably formed in a first, higher voltage IC and the silicon MOSFET is formed in a second, lower voltage IC, and the clamp circuit is formed in the first or second IC. The two ICs together are packaged to define the complete circuit, which is preferably a three terminal circuit package (the terminals being the drain of the gallium nitride or silicon carbide FET and the source and gate of the MOSFET). In another version, the clamp circuit can be a third discrete circuit which can be inside or outside the circuit package.

Note that the term "IC" is used to denote that particular circuit technology is used, and is not intended to denote that multiple components are necessarily provided. Thus, the term IC is intended to be broad enough to include a single transistor packaged as a discrete component.

The clamp circuit preferably comprises a diode circuit, having an anode connected to the gallium nitride or silicon carbide FET source and a cathode connected to the gallium nitride or silicon carbide FET gate. This circuit thus conducts when the gallium nitride or silicon carbide FET source reaches a predetermined voltage above the gallium nitride or silicon carbide FET gate/MOSFET source.

The diode circuit preferably comprises a plurality of series diodes. The number of diodes determines the overall threshold voltage at which the diodes conduct.

The gallium nitride or silicon carbide FET can comprise a high electron mobility transistor and the silicon MOSFET transistor can comprise a trench MOS transistor.

An example of the invention will now be described in detail with reference to the accompanying drawings, in which.

The invention provides a cascoded power semiconductor circuit. Emerging new power switches based on GaN and SiC (such as MOSFETs) often have depletion-mode (normally on) behaviour. Hence, they cannot be used in most power converter applications because they are turned on if the gate is unbiased and hence cause undesired fault conditions in the application. One common solution to realize an inherently safe power switch is to combine a conventional enhancement-mode (normally-off) power switch with these depletion mode (normally-on) power switches in a cascode configuration. The invention provides a clamp circuit between the source and gate of the gallium nitride or silicon carbide FET to provide avalanche protection.

Figure 2:
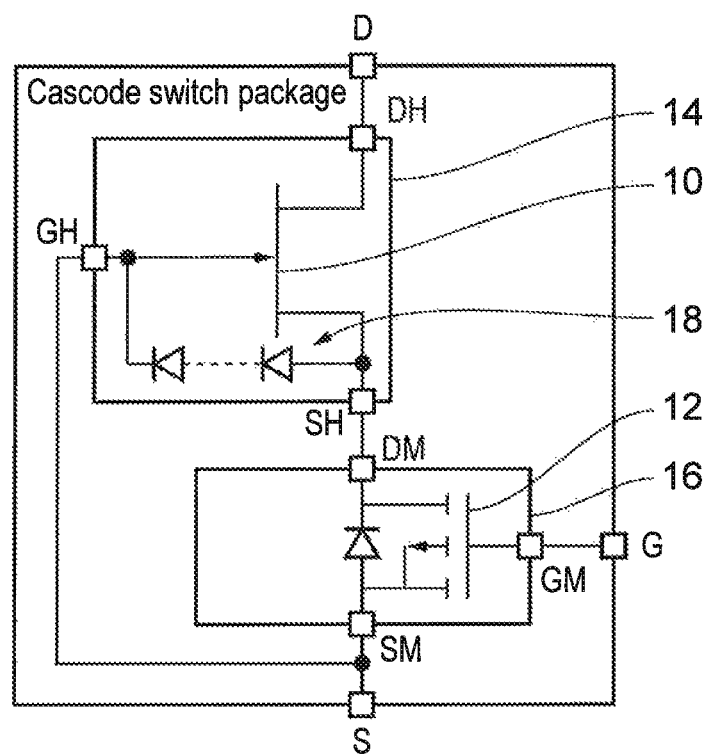
FIG. 2 shows an example of cascode circuit of the invention.

FIG. 2 shows the circuit of the invention. The circuit is a three terminal package.

The gallium nitride field effect transistor or silicon carbide field effect transistor 10 has its drain DH connected to a high power rail which is the drain terminal D of the circuit package, and its gate GH connected to a low power rail which is the source terminal S of the circuit package.

The source SH of the gallium nitride field effect transistor or silicon carbide field effect transistor 10 is connected to the drain DM of a silicon MOSFET 12 and the MOSFET source SM is connected to the source terminal S. The gate terminal G of the package connects the MOSFET gate GM.

Figure 1:
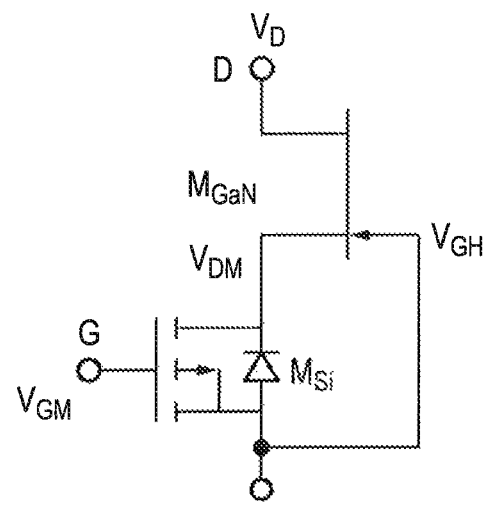
FIG. 1 shows a known cascode circuit.

To this extent, the circuit is the same as FIG. 1.

The gallium nitride or silicon carbide field effect transistor 10 is part of a high voltage IC 14 and the MOSFET 12 is part of a low voltage IC 16. The cascode circuit is thus a dual die solution in a single package in this implementation.

A clamp circuit 18 is provided between the source SH and gate GH of the gallium nitride or silicon carbide FET 10 as shown. In the example shown, the clamp circuit is part of the high voltage IC 14. However, it can be part of the low voltage IC 16 (between the drain and source terminals) or it can be a third discrete IC. It could even be outside the cascode circuit package.

The three pin package is compatible with existing power semiconductors such as silicon MOSFET's or IGBT's.

The additional clamp circuit ensures that the voltage across the low-voltage chip 16, which can be a low-voltage trench MOSFET, between nodes DM and SM does not exceed device limits.

In this way, avalanche currents through the MOSFET 12 are prevented as well as avalanche or gate isolation breakdown of the GaN/SiC field effect transistor 10 due to high source-gate voltages.

When turning off the overall circuit, the low-voltage MOSFET gate will be discharged by a gate driver connected between the nodes G and S. Once the MOSFET gate-source voltage $V_{GM}$ is at the threshold level $V_{thM}$, the silicon MOSFET will turn off. Its drain source voltage $V_{DM}$ will increase and generate the needed negative gate-source voltage to turn-off the GaN/SiC high voltage transistor.

At this moment the node DM/SH will become a floating node and the voltage across the low voltage MOSFET 12 is determined by the following equation:

$$V_{DM} = \frac{C_{DSH}V_{DH} + (C_{GSH} + C_{DSM} + C_{GDM})V_{thH}}{C_{DSH} + (C_{GSH} + C_{DSM} + C_{GDM})}$$

As indicated, the peak voltage across the low-voltage MOSFET is dependent on:
  threshold voltage of the GaN/SiC transistor 10 $V_{thH}$
  maximum cascode drain voltage $V_{DH}$
  capacitance ratios between the two devices, specifically relating to the GaN/SiC transistor drain-source capacitance $C_{DSH}$, the GaN/SiC transistor gate source capacitance $C_{GSH}$, the silicon MOSFET drain-source capacitance $C_{DSM}$ and the silicon MOSFET transistor gate-drain capacitance $C_{GDM}$.

For example, the switch can be rated for $V_{DH}$=600V, the GaN/SiC transistor has a threshold voltage $V_{thH}$=-3V and a 30V rated silicon MOSFET is used. To ensure the silicon MOSFET drain voltage $V_{DM}$ does not exceed the limit of $V_{DM}$=30V and without the clamping arrangement of the invention, the following capacitance ratio must be fulfilled:

$$\frac{(C_{GSH} + C_{DSM} + C_{GDM})}{C_{DSH}} == 21.2$$

With typical values for these components, this requirement cannot be fulfilled without integrating or adding capacitance in parallel to the silicon MOSFET.

Figure 3:
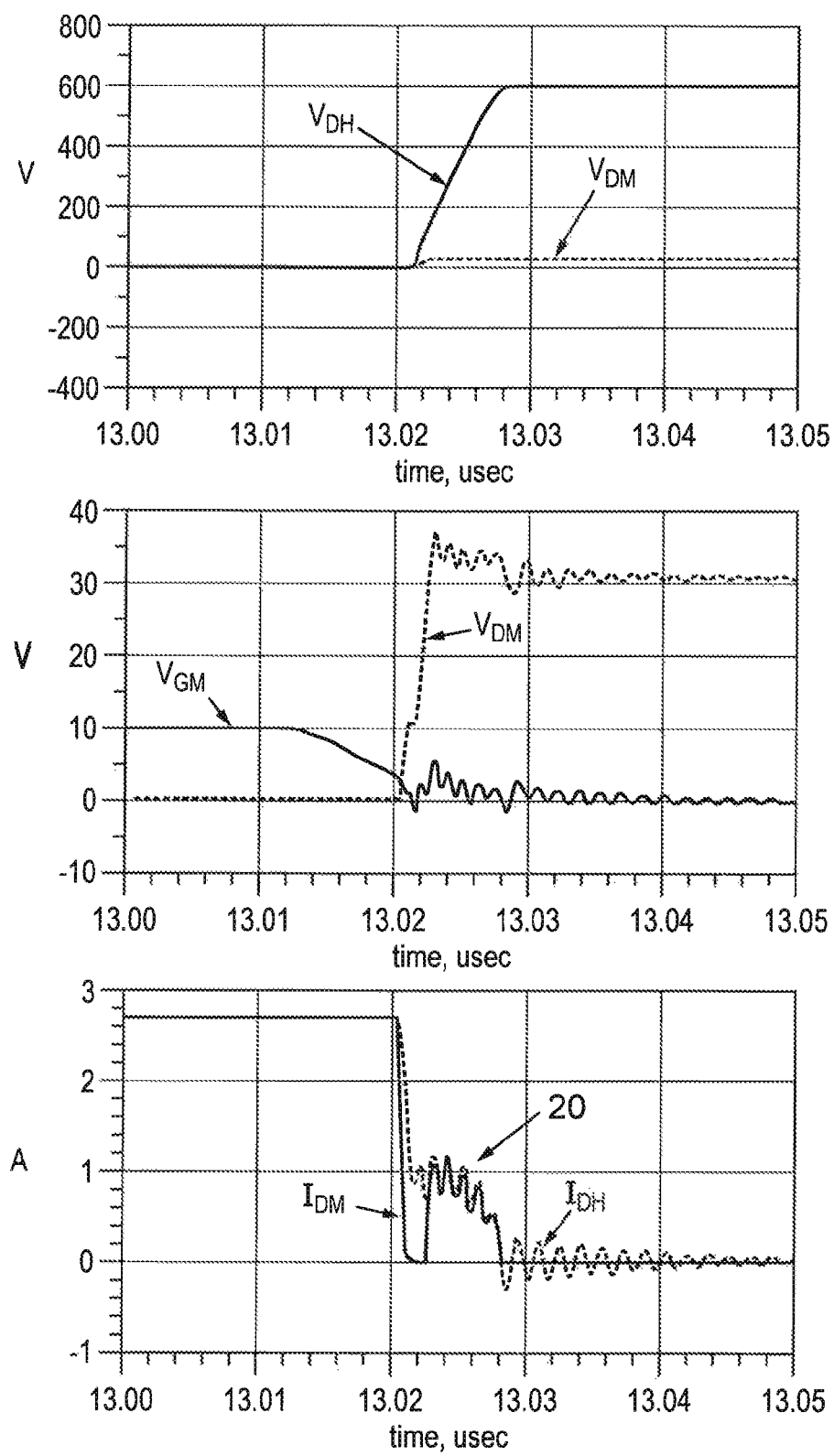
FIG. 3 shows example performance characteristics of the known circuit of FIG. 1.

FIG. 3 shows a turn-off simulation result of a cascode switch that does not fulfil the capacitance requirement and without the clamping arrangement of the invention.

The top plot shows the drain voltage $V_{DM}$ across the low-voltage MOSFET and the drain terminal voltage $V_{DH}$.

The middle plot shows the MOSFET gate voltage $V_{GM}$ and shows the turn off command starting at time 13.01 us. The middle plot also shows the MOSFET drain voltage $V_{DM}$ from which it can be seen that drain voltage across the MOSFET is exceeding the limit of 30V and the MOSFET is conducting an avalanche current after being turned off.

The bottom plot shows the MOSFET current $I_{DM}$ and the SiC/GaN power transistor current $I_{DH}$. The MOSFET avalanche current conduction is seen at region 20.

The low-voltage MOSFET will conduct an avalanche current during every turn-off in an application. Hence, operating this cascode switch in a power converter circuit leads to repetitive avalanche currents which reduce lifetime and reliability.

Figure 4:
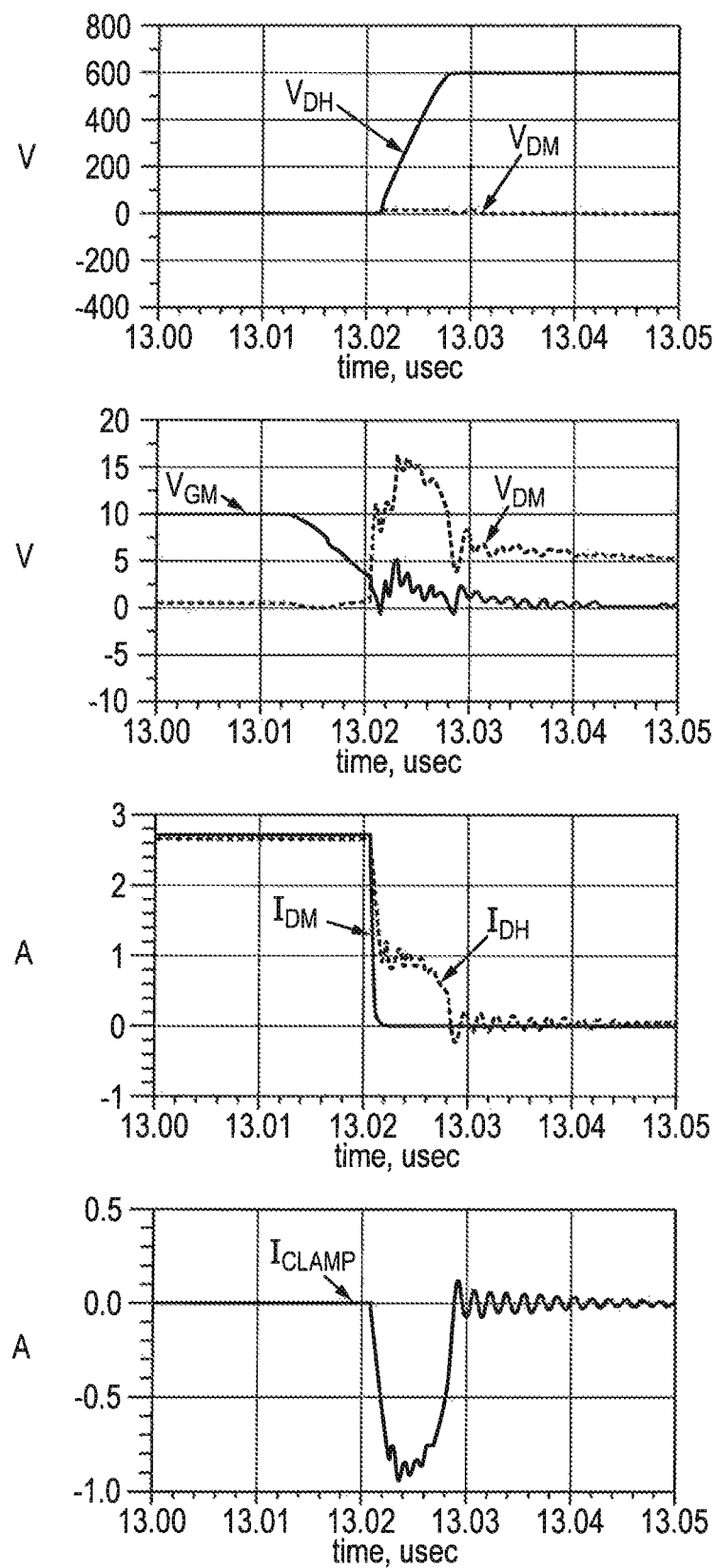
FIG. 4 shows performance characteristics of the circuit of FIG. 2.

FIG. 4 shows simulation results of the cascade switch turn-off under the same operating conditions but with the clamp circuit applied. The top three plots show the same parameters as in FIG. 3. The bottom plot shows the current $I_{CLAMP}$ conducted by the clamp circuit.

The voltage across the MOSFET 12 is now limited to 16V. The charge current that had been conducted by the MOSFET as an avalanche current is now conducted by the clamp circuit.

The invention can for example be applied to a high voltage (e.g. 600V rated) GaN HEMT.

By way of example, the clamp circuit can comprise six low-voltage Schottky diodes connected in series. The diodes can for example take up about 10% of the total chip area. This additional clamp circuit prevents the low voltage MOSFET from reaching avalanche conditions. By using this clamp circuit, lower voltage rated MOSFETs can be used (e.g. $V_{DM}$<25V) which offers the opportunity to significantly reduce silicon MOSFET chip size or to combine GaN power devices with lateral silicon IC technologies.

In case of a 600V/90 mΩ GaN HEMT, a low voltage MOSFET with a $R_{DS(on)}$=9 mΩ can be used (to provide the typical 10% of the GaN HEMT on-resistance $R_{DS(on)}$) to form the cascode switch.

The table below shows the basic characteristics for one example of trench MOSFET technology for different breakdown voltages:

| $BV_{DSS}$/V | $R_{DS(on)}$/ mΩ * mm$^2$ | $Q_{Gtot}$/ nC/mm$^2$ | Die size/ mm$^2$ | $R_{DS(on)}$/ mΩ | $Q_{Gtot}$/nC |
|---|---|---|---|---|---|
| 25 | 8.5 | 3.78 | 0.95 | 9 | 3.6 |
| 60 | 28 | 5.67 | 3.11 | 9 | 17.6 |
| 80 | 54 | 5.81 | 6.00 | 9 | 34.9 |

Without the clamp circuit, a MOSFET with voltage rating of 60V or 80V would be needed instead of a 25V rated device. The table above shows the advantages of using a lower rated MOSFET.

In particular, selecting an 80V rated MOSFET to form a cascode switch would result in approximately six times larger die size and a ten times higher gate charge. Even if a different $R_{DS(on)}$ ratio between the GaN HEMT and MOSFET chip would be chosen, the circuit of the invention with a 25V rated MOSFET will outperform the 80V MOSFET version.

The clamp circuit thus improves the cascode switch performance mainly in two aspects:

With a significantly smaller MOSFET chip a lower minimum $R_{DS(on)}$ of a cascode switch in a given power package can be achieved.

With a significantly smaller MOSFET gate charge, switching speed will be increased and driver losses will be decreased. This achievement enables possibilities to go for higher switching frequencies and smaller power supply designs.

The invention can be used in all power conversion applications in which normally-off switches are required, and enables the use of normally-on GaN or SiC devices in such applications. By way of example, the invention can be used in:

power factor correction (PFC) circuits, for example as used in grid connected power supplies;

phase legs of high voltage inverter circuits, for example motor drives or photovoltaic converters;

a switched mode (e.g. soft switching) power converter circuits.

The clamp circuit has been shown based on Schottky diodes. Other diodes, or transistors (such as diode-connected transistors), or other unidirectional devices can instead be used.

Other variations to the disclosed embodiments can be understood and effected by those skilled in the art in practicing the claimed invention, from a study of the drawings, the disclosure, and the appended claims. The mere fact that certain measures are recited in mutually different dependent claims does not indicate that a combination of these measured cannot be used to advantage. Any reference signs in the claims should not be construed as limiting the scope.

The invention claimed is:

1. A cascode transistor circuit comprising:
   a gallium nitride field effect transistor or a silicon carbide field effect transistor having its drain connected to a high power rail and its gate directly connected to a low power rail;
   a silicon MOSFET with its drain connected to the source of the gallium nitride or silicon carbide FET and its source (SM) directly connected to the low power rail; and
   a clamp circuit that includes a diode connected between the source and gate of the gallium nitride or silicon carbide FET and that is configured to shunt current in a forward bias mode to clamp a voltage across the drain and source of the silicon MOSFET.

2. A cascode transistor circuit as claimed in claim 1, wherein the clamp circuit limits the voltage of the gallium nitride or silicon carbide FET source with respect to its gate, and the voltage of the silicon MOSFET drain with respect to its source and wherein the cascode transistor circuit does not include a capacitor connected between the gate of the gallium nitride field effect transistor and the low power rail.

3. A cascode transistor circuit as claimed in claim 1, wherein the gallium nitride or silicon carbide FET is formed in a first, higher voltage IC and the silicon MOSFET is formed in a second, lower voltage IC, and wherein the clamp circuit is formed in the first or the second IC and wherein the cascode transistor circuit does not include an additional diode configured to shunt current in a forward bias mode from the gate of the gallium nitride or silicon carbide FET to the source of the gallium nitride or silicon carbide FET.

4. A cascode transistor circuit as claimed in claim 1, wherein the gallium nitride or silicon carbide FET is formed in a first, higher voltage IC and the silicon MOSFET is formed in a second, lower voltage IC, and the clamp circuit is formed as a third discrete circuit.

5. A cascode transistor circuit as claimed in claim 1, wherein the diode is a Schottky diode that has an anode connected to the gallium nitride or silicon carbide FET source and a cathode connected to the gallium nitride or silicon carbide FET gate.

6. A cascode transistor circuit as claimed in claim 5, wherein the clamp circuit comprises a plurality of diodes connected in series between the gallium nitride or silicon carbide FET source and the gallium nitride or silicon carbide FET gate.

7. A cascode transistor circuit as claimed in claim 1, wherein the gallium nitride or silicon carbide FET comprises a high electron mobility transistor.

8. A cascode transistor circuit as claimed in claim 1, wherein the silicon MOSFET transistor comprises a trench MOS transistor.

9. A circuit arrangement comprising:
   a cascode transistor circuit as claimed in claim 1; and
   a gate driver circuit having a gate output line for driving the gate of the silicon MOSFET.

10. A power supply comprising a circuit arrangement as claimed in claim 9.

11. A power factor correction circuit comprising a circuit arrangement as claimed in claim 9.

12. An inverter circuit comprising a circuit arrangement as claimed in claim 9.

13. A switched mode power converter circuit comprising a circuit arrangement as claimed in claim 9.

* * * * *